(12) United States Patent
Takayama (10) Patent No.: US 12,108,631 B2
(45) Date of Patent: Oct. 1, 2024

(54) DISPLAY DEVICE

(71) Applicant: Japan Display Inc., Tokyo (JP)

(72) Inventor: Masaru Takayama, Tokyo (JP)

(73) Assignee: Japan Display Inc., Tokyo (JP)

( * ) Notice: Subject to any disclaimer, the term of this patent is extended or adjusted under 35 U.S.C. 154(b) by 383 days.

(21) Appl. No.: 17/645,584

(22) Filed: Dec. 22, 2021

(65) Prior Publication Data

US 2022/0223669 A1     Jul. 14, 2022

(30) Foreign Application Priority Data

Jan. 14, 2021   (JP) ................................. 2021-004113

(51) Int. Cl.
   *H10K 59/122*   (2023.01)

(52) U.S. Cl.
   CPC .................................. *H10K 59/122* (2023.02)

(58) Field of Classification Search
   None
   See application file for complete search history.

(56) References Cited

U.S. PATENT DOCUMENTS

| | | | | |
|---|---|---|---|---|
| 7,888,864 B2 * | 2/2011 | Young | ..................... | H10K 59/86 313/506 |
| 8,610,344 B2 * | 12/2013 | Matsuda | ............... | G03F 7/0035 313/506 |
| 8,928,011 B2 * | 1/2015 | Tanada | ................... | H10K 59/86 313/503 |
| 8,928,018 B2 * | 1/2015 | Ikeda | .................... | H10K 59/131 438/22 |
| 9,337,244 B2 * | 5/2016 | Hatano | .............. | H10K 50/8428 |
| 11,217,640 B2 * | 1/2022 | Jung | .................... | H01L 27/1248 |
| 11,610,954 B1 * | 3/2023 | Lin | ....................... | H10K 50/844 |
| 2002/0014836 A1 * | 2/2002 | Codama | ............... | H10K 50/814 313/506 |
| 2003/0060055 A1 * | 3/2003 | Kamijima | ............ | G11B 5/3163 257/E21.027 |
| 2004/0160170 A1 | 8/2004 | Sato et al. | | |

(Continued)

FOREIGN PATENT DOCUMENTS

| | | |
|---|---|---|
| JP | 2000-195677 A | 7/2000 |
| JP | 2004-207217 A | 7/2004 |

(Continued)

OTHER PUBLICATIONS

Japanese Office Action dated Jun. 25, 2024, in corresponding Japanese Application No. 2021-004113, 6 pages.

*Primary Examiner* — Evren Seven
(74) *Attorney, Agent, or Firm* — Maier & Maier, PLLC (57) ABSTRACT

According to one embodiment, a display device includes a second insulating layer having a first opening and a second opening, a partition disposed on the second insulating layer, a first organic layer, a first upper electrode. The partition includes a first layer formed of a metal material and including a first side surface and a second side, and a second layer including a bottom surface. The first upper electrode is in contact with the first side surface, the bottom surface extends from the first side surface toward the first opening and extends from the second side surface toward the second opening. A lower portion of the second layer has an inverted tapered shape whose width increases as it is closer to top from the bottom surface.

17 Claims, 7 Drawing Sheets

(56) References Cited

U.S. PATENT DOCUMENTS

| | | | | |
|---|---|---|---|---|
| 2006/0170340 A1* | 8/2006 | Tzen | ................. | H10K 59/38 |
| | | | | 313/506 |
| 2009/0009069 A1* | 1/2009 | Takata | ................. | H10K 59/122 |
| | | | | 445/24 |
| 2012/0217516 A1* | 8/2012 | Hatano | ................. | H10K 50/8428 |
| | | | | 257/E33.062 |
| 2021/0066419 A1* | 3/2021 | Byun | ................. | H10K 71/00 |
| 2021/0091158 A1 | 3/2021 | Kasahara | | |
| 2022/0416197 A1* | 12/2022 | Chen | ................. | H10K 59/173 |
| 2023/0123636 A1* | 4/2023 | Hirase | ................. | G09F 9/30 |
| | | | | 257/72 |

FOREIGN PATENT DOCUMENTS

| | | |
|---|---|---|
| JP | 2008-135325 A | 6/2008 |
| JP | 2009-32673 A | 2/2009 |
| JP | 2010-118191 A | 5/2010 |
| KR | 1020160137715 A | 12/2016 |
| WO | WO 2019/026511 A1 | 2/2019 |

\* cited by examiner

DISPLAY DEVICE

CROSS-REFERENCE TO RELATED APPLICATIONS

This application is based upon and claims the benefit of priority from Japanese Patent Application No. 2021-004113, filed Jan. 14, 2021, the entire contents of which are incorporated herein by reference.

FIELD

Embodiments described herein relate generally to a display device.

BACKGROUND

In recent years, display devices in which organic light-emitting diodes (OLEDs) are applied as display elements have been used in practical applications. The display element comprises an organic layer between a pixel electrode and a common electrode. The organic layer includes, in addition to the light-emitting layer, functional layers such as a hole transport layer and an electron transport layer. Such an organic layer is formed, for example, by a vacuum deposition method.

For example, in the case of vapor deposition using mask, a fine mask with openings corresponding to various pixels is applied. However, due to the processing accuracy of the fine mask, deformation of the shape of openings, etc., the accuracy of formation of the thin film formed by vapor deposition may be lowered. Under these circumstances, there is a demand of forming organic layers of desired shapes without applying the fine mask.

Here, for example, a technology is known that an organic layer and a cathode (a second electrode) are divided using a pixel dividing structure. In such a technology, it is required to electrically connect a cathode to a feed line for power supply securely in order to supply a predetermined potential to the divided cathodes.

DETAILED DESCRIPTION

In general, according to one embodiment, a display device comprises an insulating substrate, a first insulating layer disposed above the insulating substrate, a first lower electrode and a second lower electrode disposed on the first insulating layer, a second insulating layer disposed between the first lower electrode and the second lower electrode on the first insulating layer and comprising a first opening overlapping the first lower electrode and a second opening overlapping the second lower electrode, a partition disposed on the second insulating layer, a first organic layer including a light-emitting layer, disposed in the first opening and covering the first lower electrode, and a first upper electrode covering the first organic layer. The partition includes a first layer in contact with the second insulating layer, formed of a metal material and including a first side surface facing the first opening, a second side surface facing the second opening, and a first upper surface and a second layer including a bottom surface in contact with the first upper surface, a third side surface facing the first opening, a fourth side surface facing the second opening, and a second upper surface. The first upper electrode is in contact with the first side surface, the bottom surface extends from the first side surface toward the first opening and extends from the second side surface toward the second opening, and a lower portion of the second layer, including the bottom surface, has an inverted tapered shape in cross section, a width of which increases as it is closer to a top from the bottom surface.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane. Further, viewing towards the X-Y plane is referred to as planar view. A direction on the observer side along the third direction is referred to as an upper side, and a surface on the observer side along the third direction is referred to as an upper surface. A direction opposite to the observer along the third direction is referred to as a lower side or a bottom side, and a surface opposite to the observer along the third direction is referred to as a lower surface or a bottom surface.

The display device DSP of this embodiment is an organic electroluminescent display device comprising an organic light-emitting diode (OLED) as a display element, and can be mounted on televisions, personal computers, mobile terminals, cell phones and the like. Note that display element described below can be applied as a light-emitting element of an illumination device, and the display device DSP can be converted to some other electronic device such a illumination device.

Figure 1:
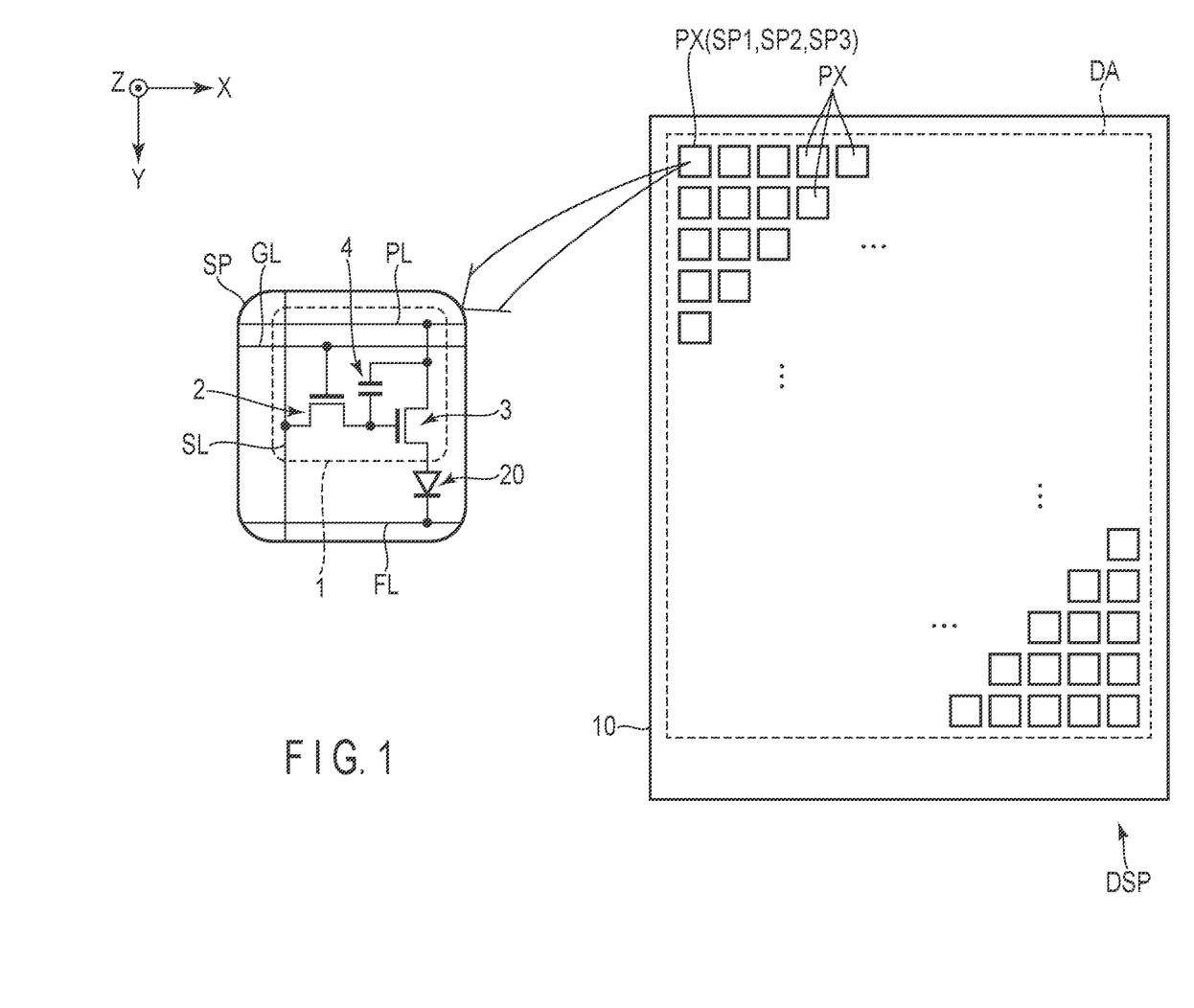
FIG. 1 is a diagram showing a configuration example of a display device DSP according to one embodiment.

FIG. 1 is a diagram showing an example configuration of a display device DSP of this embodiment. The display device DSP comprises a display area DA which displays images, on an insulating base 10. The base 10 is an insulating substrate and may be glass or a flexible resin film.

The display area DA comprises a plurality of pixels PX arranged in a matrix along the first direction X and the second direction Y in the display area DA. The pixels PX each comprises a plurality of subpixels SP1, SP2 and SP3. For example, each pixel PX comprises a red subpixel SP1, a green subpixel SP2 and a blue subpixel SP3. In place of the three subpixels of the three colors, the pixel PX may contain four or more subpixels of other colors, including white.

A configuration example of one subpixel SP contained in a pixel PX will be briefly described.

That is, the subpixel SP comprises a pixel circuit 1 and a display element 20 that is driven and controlled by the pixel circuit 1. The pixel circuit 1 comprises a pixel switch 2, a drive transistor 3 and a capacitor 4. The pixel switch 2 and the drive transistor 3 are switch elements constituted by thin-film transistors, for example.

In the pixel switch 2, a gate electrode thereof is connected to a scanning line GL, a source electrode is connected to a signal line SL and a drain electrode is connected to one of the electrodes constituting the capacitor 4 and the gate electrode of the drive transistor 3. In the drive transistor 3, a source electrode thereof is connected to the other electrode of the capacitor 4 and a power line PL, and a drain electrode is connected to an anode of the display element 20. A cathode of the display element 20 is connected to a power feed line FL. Note that the configuration of the pixel circuit 1 is not limited to that of the example shown in the figure.

The display element 20 is an organic light-emitting diode (OLED), which is a light-emitting element. For example, a subpixel SP1 comprises a display element that emits light corresponding to the red wavelength, a subpixel SP2 comprises a display element that emits light corresponding to the green wavelength, and a subpixel SP3 comprises a display element that emits light corresponding to the blue wavelength. The pixel PX comprises multiple subpixels SP1, SP2 and SP3 of display colors different from each other, and with this configuration, multi-color display can be realized.

Note that the display element 20 may be configured so that the subpixels SP1, SP2 and SP3 emit light of the same color. Thus, monochromatic display can be realized.

Here, when the display elements 20 of the subpixels SP1, SP2 and SP3 are configured to emit white light, a color filter may be disposed to oppose the display elements 20. For example, the subpixel SP1 comprises a red color filter opposing the respective display element 20, the subpixel SP2 comprises a green color filter opposing the respective display element 20, and the subpixel SP3 comprises a blue color filter opposing the respective display element 20. With this structure, it is possible to realize multi-color display.

Alternatively, when the display elements 20 of the subpixels SP1, SP2 and SP3 are configured to emit ultraviolet light, a photo conversion layer is provided to oppose the display elements 20, and thus the multi-color display can be realized.

The configuration of the display elements 20 will be described later.

Figure 2:
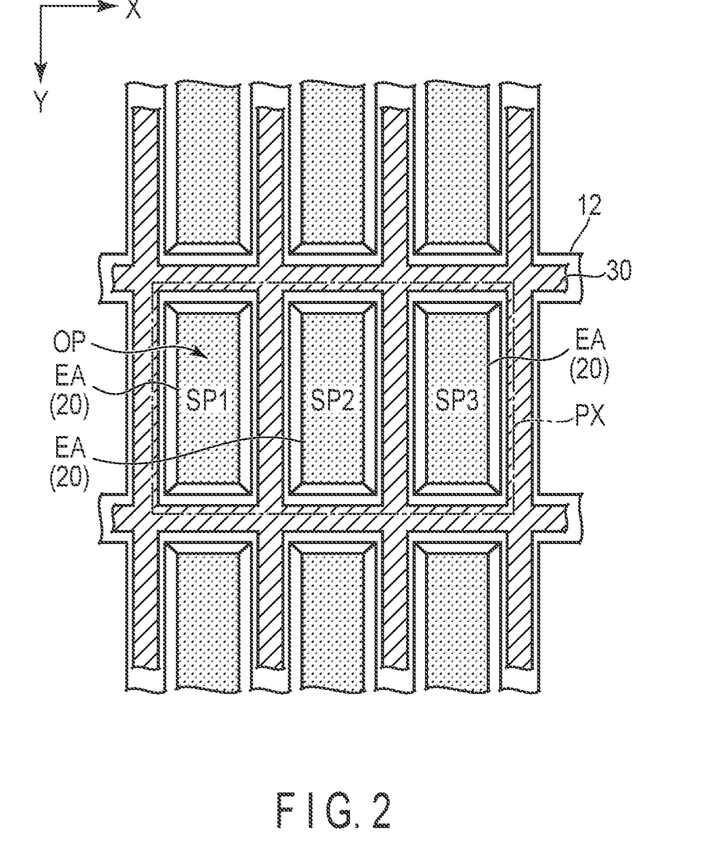
FIG. 2 is a plan view showing an example of a pixel PX shown in FIG. 1.

FIG. 2 is a plan view showing an example of a pixel PX shown in FIG. 1.

The subpixels SP1, SP2 and SP3 that constitute one pixel PX are each formed into a rectangular shape elongated along the second direction Y, and are aligned along the first direction X. The outer shape of the subpixels corresponds to the outer shape of the light-emitting area EA in the display element 20, but it is shown in a simplified way and therefore it does not necessarily reflect the actual shape. Here, it is assumed that the light-emitting area EA is formed into a rectangular shape with short sides extending along the first direction X and long sides extending along the second direction Y.

The insulating layer 12, which will be described in detail later, is formed into a grid pattern extending along the first and second directions X and Y in planar view, which surrounds each of the subpixels SP1, SP2 and SP3, or the display element 20 of each subpixel. The insulating layer 12 with such a configuration may be referred to as ribs, partitions, banks, etc. The light-emitting area EA is formed in each opening OP of the insulating layer 12.

The partition 30, which will be described in detail later, is formed in a grid pattern extending along the first and second directions X and Y in planar view, and is disposed on the insulating layer 12. The sub-pixels SP1, SP2 and SP3 are respectively surrounded by the partition 30.

Figure 3:
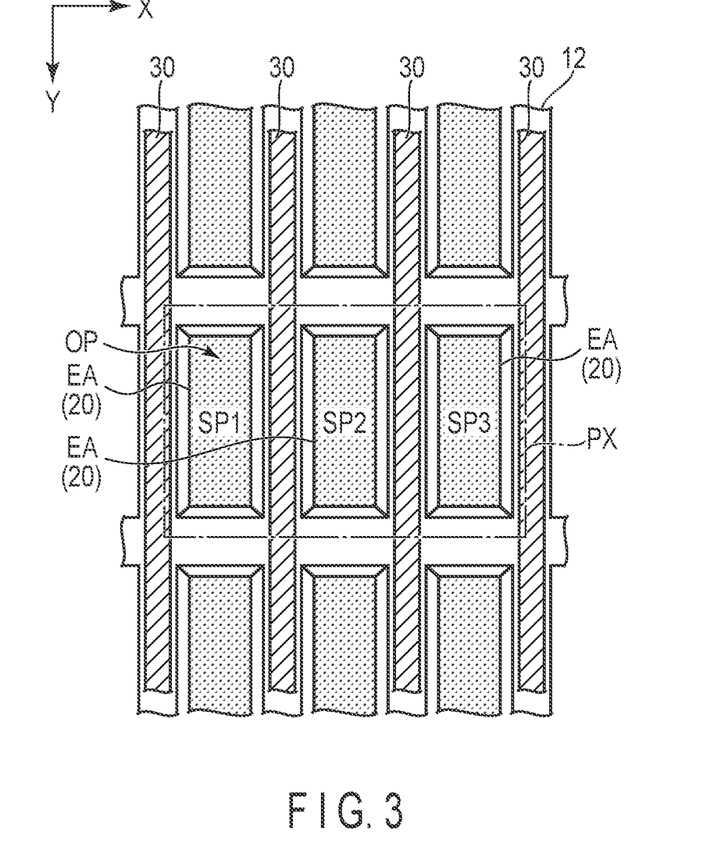
FIG. 3 is a plan view showing another example of the pixel PX shown in FIG. 1.

FIG. 3 is a plan view showing another example of the pixel PX shown in FIG. 1.

The example shown in FIG. 3 is different from that of FIG. 2 in that each of the partitions 30 is formed into a stripe pattern in planar view. The partitions 30 each extend along the second direction Y and are aligned in the first direction X. Each of the sub-pixels SP1, SP2 and SP3 is located between a respective adjacent pair of partitions 30. In other words, the sub-pixels and the partitions are alternately aligned in the first direction X. The sub-pixels are disposed in the second direction Y without interposing the partition.

The insulating layer 12 is formed into a grid pattern as in the example shown in FIG. 2, but may be formed into a stripe pattern as in the case of the partitions 30.

Figure 4:
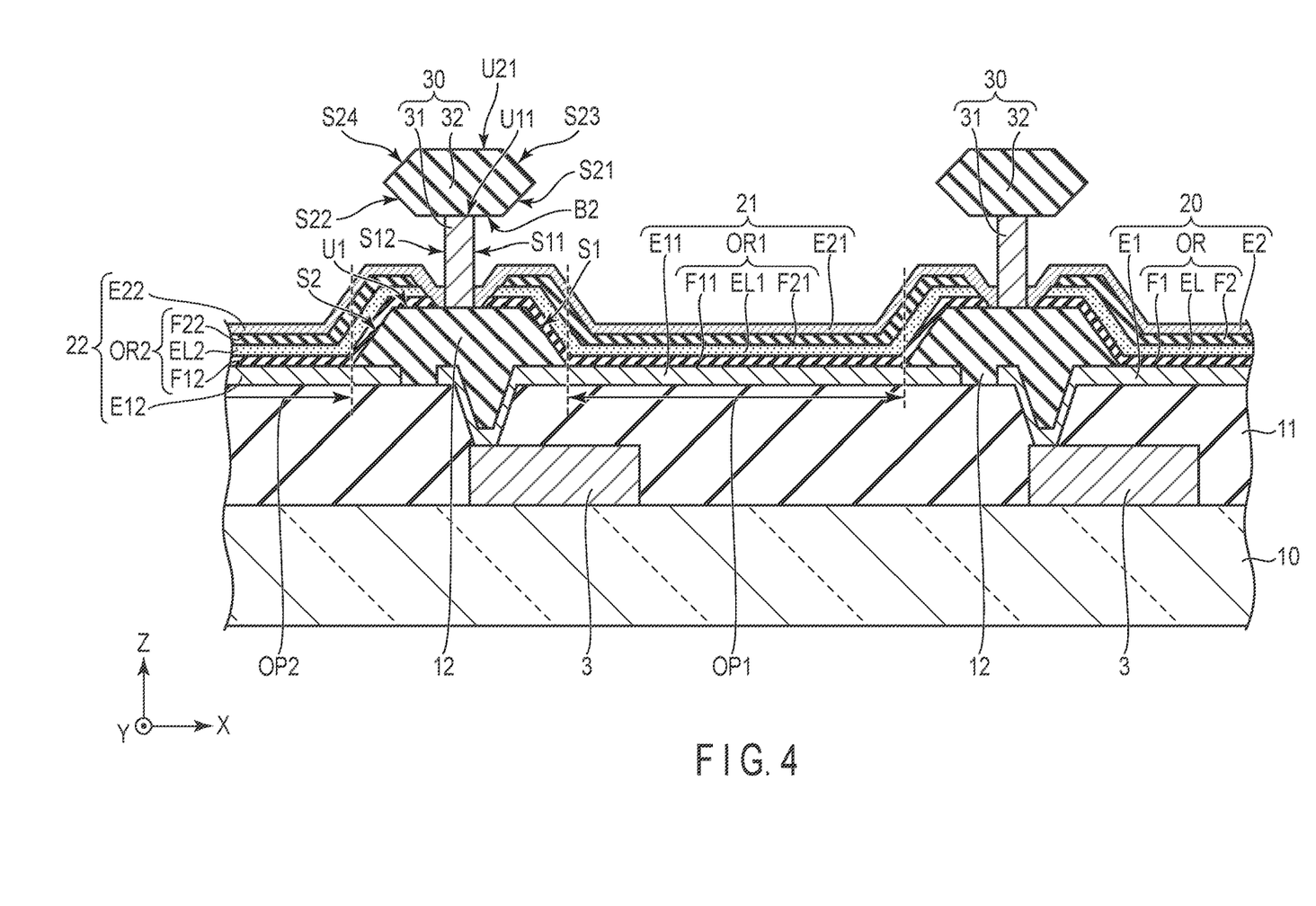
FIG. 4 is a cross sectional view showing an example of a display element 20.

FIG. 4 is a cross-sectional view showing an example of the display element 20.

The pixel circuit 1 shown in FIG. 1 is disposed on the base 10 and covered by an insulating layer 11. FIG. 4 illustrates the drive transistor 3 contained in the pixel circuit 1 in a simplified form. The insulating layer (first insulating layer) 11 corresponds to an underlying layer of the display element 20. An insulating layer (second insulating layer) 12 is disposed on the insulating layer 11. The insulating layers 11 and 12 are, for example, organic insulating layers.

The display element 20 comprises a lower electrode E1, an organic layer OR and an upper electrode E2. The lower electrode E1 is an electrode arranged for each sub-pixel or each display element, and is electrically connected to the drive transistor 3. The lower electrode E1 with such a configuration may be referred to as a pixel electrode, anode or the like. The upper electrode E2 is an electrode arranged for each sub-pixel or each display element, but is electrically connected over a plurality of adjacent sub-pixels or plurality of display elements to each other. The upper electrode E2 with such a configuration may be referred to as a common electrode, counter-electrode, cathode or the like.

The lower electrode E1 is disposed on the insulating layer 11, and its peripheral portion is covered by the insulating layer 12. The lower electrode E1 is, for example, a metal electrode formed of a metal material such as silver or aluminum. The lower electrode E1 may be, for example, a transparent electrode formed of a transparent conductive material such as indium tin oxide (ITO) or indium zinc oxide (IZO). The lower electrode E1 may as well be a stacked body of a transparent electrode and a metal electrode. For example, the lower electrode E1 may be configured as a stacked body consisting of a transparent electrode, a metal electrode and a transparent electrodes stacking one on another in this order, or may be configured as a stacked body consisting of three or more layers. The lower electrode E1 may be configured to be different from other regions in a partial region. In the top emission type display device 20, the lower electrode E1 includes a metal electrode as a reflective electrode.

The organic layer OR is disposed on the lower electrode E1. The organic layer OR includes a light-emitting layer EL. In the example shown in FIG. 4, the organic layer OR further includes functional layers F1 and F2. The functional layer F1, the light-emitting layer EL and the functional layer F2 are stacked in order from the side of the lower electrode E1. The functional layers F1 and F2 are, for example, a hole injection layer, a hole transport layer, a hole blocking layer, an electron injection layer, an electron transport layer, and an electron blocking layer, but may as well be other functional layers. In addition, each of the functional layers F1 and F2 shown in the figure is not limited to a single layer, but may be a stacked body in which multiple functional layers are stacked. Further, at least one of the functional layers F1 and F2 may be omitted.

The upper electrode E2 covers the organic layer OR. The upper electrode E2 is, for example, a semi-transmissive metal electrode formed of a metal material such as magnesium or silver. The upper electrode E2 may be a transparent electrode formed of a transparent conductive material such as ITO or IZO. The upper electrode E2 may as well be a stacked body of a transparent electrode and a metal electrode. The upper electrode E2 may be configured to be different from other regions in a partial region. The upper electrode E2 is electrically connected to a power feed line disposed in the display area DA or a power feed line disposed on an outer side of the display area DA.

When the potential of the lower electrode E1 is relatively higher than that of the upper electrode E2, the lower electrode E1 corresponds to the anode and the upper electrode E2 corresponds to the cathode. Or, when the potential of the upper electrode E2 is relatively higher than that of the lower electrode E1, the upper electrode E2 corresponds to the anode and the lower electrode E1 corresponds to the cathode.

For example, when the lower electrode E1 corresponds to the anode, the functional layer F1 between the light-emitting layer EL and the lower electrode E1 includes at least one of a hole injection layer and a hole transport layer, and the functional layer F2 between the light-emitting layer EL and the upper electrode E2 includes at least one of an electron transport layer and an electron injection layer.

Here, two display elements adjacent to each other in the first direction X will be focused. For the sake of convenience, the display element located in the center of the figure is denoted as a display element 21, and the display element located on the left side of the figure is denoted as a display element 22.

The display element 21 comprises a lower electrode (first lower electrode) E11, an organic layer (first organic layer) OR1 and an upper electrode (first upper electrode) E21. The organic layer OR1 comprises a functional layer F11, a light-emitting layer EL1 and a functional layer F21.

The display element 22 comprises a lower electrode (second lower electrode) E12, an organic layer (second organic layer) OR2 and an upper electrode (second upper electrode) E22. The organic layer OR2 comprises a functional layer F12, a light-emitting layer EL2 and a functional layer F22. The lower electrodes E11 and E12 are aligned to be spaced apart from each other along the first direction X.

The insulating layer 12 is disposed between the lower electrode E11 and the lower electrode E12. The insulating layer 12 includes a first opening OP1, a second opening OP2, sloping surfaces S1 and S2 and an upper surface U1.

The first opening OP1 is a through hole formed in the region overlapping the lower electrode E11 and penetrating the insulating layer 12 to the lower electrode E11. The peripheral portion of the lower electrode E11 is covered by the insulating layer 12, and the central portion of the lower electrode E11 is exposed from the insulating layer 12 in the first opening OP1.

The second opening OP2 is a through hole formed in the region overlapping the lower electrode E12 and penetrating the insulating layer 12 to the lower electrode E12. The peripheral portion of the lower electrode E12 is covered by the insulating layer 12, and the central portion of the lower electrode E12 is exposed from the insulating layer 12 in the second opening OP2.

The upper surface U1 and the sloping surfaces S1 and S2 correspond to surfaces of the insulating layer 12 which are between the first opening OP1 and the second opening OP2. The sloping surface S1 faces the first opening OP1. The sloping surface S2 faces the second opening OP2. The upper surface U1 is located between the sloping surface S1 and the sloping surface S2. Note that the upper surface U1 and the sloping surfaces S1 and S2 are, for example, flat surfaces, but they may as well be curved surfaces.

The organic layer OR1 is disposed in the first opening OP1 and covers the lower electrode E11. In the example shown in FIG. 4, the organic layer OR1 is disposed on the sloping surface S1 and further on a part of the upper surface U1. The upper electrode E21 is stacked on the organic layer OR1. The portion of the organic layer OR1, which is located between the lower electrode E11 and the upper electrode E21 without interposing the insulating layer 12 therebetween, can form a light-emitting area of the display element 21. The portion of the organic layer OR1, which is disposed on the slope surface S1 and the upper surface U1 is located between the insulating layer 12 and the upper electrode E21, and therefore the portion does not substantially emit light.

The organic layer OR2 is disposed in the second opening OP2 and covers the lower electrode E12. In the example shown in FIG. 4, the organic layer OR2 is disposed on the slope surface S2 and further on a part of the upper surface U1. In the upper surface U1, the organic layer OR2 is spaced apart from the organic layer OR1. The upper electrode E22 is stacked on the organic layer OR2. The upper electrode E22 is spaced apart from the upper electrode E21. The portion of the organic layer OR2, which is located between the lower electrode E11 and the upper electrode E22 without interposing the insulating layer 12 therebetween, can form a light-emitting area of the display element 22. The portion of the organic layer OR2, which disposed on the slope surface S2 and the upper surface U1 is located between the insulating layer 12 and the upper electrode E22, and therefore it does not substantially emit light.

The partition 30 is located between the display element 21 and the display element 22, and are disposed above the insulating layer 12. To be more specific, the partition 30 include a first layer 31 and a second layer 32 disposed on the first layer 31.

The first layer 31 is in contact with the upper surface U1 of the insulating layer 12, and is disposed between the organic layer OR1 and the organic layer OR2, and between the upper electrode E21 and the upper electrode E22. The first layer 31 is formed of a metal material. In other words, the first layer 31 is an electric conductor. The first layer 31 comprises a first side surface S11 facing the first opening OP1, a second side surface S12 facing the second opening OP2 and a first upper surface U11 between the first side surface S11 and the second side surface S12. The first layer 31 with such a structure is formed into a grid pattern as shown in FIG. 2 or a stripe pattern as shown in FIG. 3 in planar view.

The second layer 32 is in contact with the first upper surface U11 and is spaced apart from the insulating layer 12. The second layer 32 may be a conductor formed of a metal material or an insulator formed of an insulating material. The second layer 32 protrudes from the first side surface S11 toward the first opening OP1 and further protrudes from the second side surface S12 toward the second opening OP2 in the first direction X.

The second layer 32 comprises a bottom surface B2 in contact with the first upper surface U11, a third side surface S21 facing the first opening OP1, a fourth side surface S22 facing the second opening OP2 and a second upper surface U21 between the third side surface S21 and the fourth side surface S22. The bottom surface B2 extends from the first side surface S11 toward the first opening OP1 and also extends from the second side surface S12 toward the second opening OP2 in the first direction X. The third side surface S21 and the fourth side surface S22 are side surfaces of the second layer 32, which are located on a lower side and are connected to the bottom surface B2.

In the cross-sectional view of the X-Z plane defined by the first direction X and the third direction Z, the lower portion of the second layer 32, including the bottom surface B2, is formed such that the width thereof along the first direction X increases as the location is closer to the top from the bottom surface B2 along the third direction Z. In other words, the lower portion of the second layer 32 has an inverted tapered shape in its cross section.

In the example shown in FIG. 4, the second layer 32 further comprises a fifth side surface S23 connecting the third side surface S21 with the second upper surface U21, and a sixth side surface S24 connecting the fourth side surface S22 with the second upper surface U21. The fifth side surface S23 and the sixth side surface S24 are side surfaces of the second layer 32, which are located on an upper portion. In the cross-sectional view of the X-Z plane, the upper portion of the second layer 32, including the second upper surface U21, is formed such that the width along the first direction X decreases as the location is closer to the top along the third direction Z. In other words, the upper portion of the second layer 32 is formed such that the width along the first direction X increases as the location is closer to the bottom from the second upper surface U21 along the third direction Z. That is, the upper portion of the second layer 32 has a forward tapered shape in its cross section.

Note that the fifth side surface S23 and the sixth side surface S24 may be omitted. In other words, the second layer 32 may be formed in a trapezoidal shape, and the third side surface S21 and the fourth side surface S22 may be connected to the second upper surface U21. The thickness of the lower portion having the inverted tapered shape should preferably be greater than the thickness of the upper portion of the forward tapered shape.

The second layer 32 with such a configuration overlaps the first layer 31 in planar view, and is formed into a grid pattern as shown in FIG. 2, or into a stripe pattern as shown in FIG. 3.

The upper electrode E21 is in contact with the first side surface S11 of the first layer 31. The upper electrode E22 is in contact with the second side surface S12 of the first layer 31. With this configuration, the upper electrodes E21 and E22 are spaced apart from each other along the first direction X but they are electrically connected to the partition 30, respectively. In other words, the upper electrode E21 is electrically connected to the upper electrode E22 through the partition 30 (or the first layer 31).

The organic layer OR1 is spaced apart from the first side surface S11. The upper electrode E21 is in contact with the upper surface U1 of the insulating layer 12 between the first side surface S11 and the organic layer OR1. Further, the upper electrode E21 covers the peripheral portion of the organic layer OR1. That is, the end surfaces of the functional layer F11, the light-emitting layer EL1 and the functional layer F21 are covered by the upper electrode E21.

The organic layer OR2 is spaced apart from the second side surface S12. The upper electrode E22 is in contact with the upper surface U1 of the insulating layer 12 between the second side surface S12 and the organic layer OR2. Further, the upper electrode E22 covers the peripheral portion of the organic layer OR2. That is, the end surfaces of the functional layer F12, the light-emitting layer EL2 and the functional layer F22 are covered by the upper electrode E22.

The partitions 30 described above are each disposed between each respective adjacent pair of display elements 20 or on the upper surface U1 of the respective insulating layer 12. The upper electrode E2 which constitutes each of the display elements 20 is in contact with the first side surface S11 or the second side surface S12 of the first layer 31, thus electrically connecting them each other. Focusing on each display element 20, partitions 30 are disposed on both sides of the opening OP, and one end of the upper electrode E2 is in contact with a side surface of one first layer 31 and the other end of the upper electrode E2 is in contact with a side surface of the other first layer 31. With this configuration, the upper electrodes E2 of the multiple display elements 20 disposed in the display area DA are electrically connected to each other.

Figure 5:
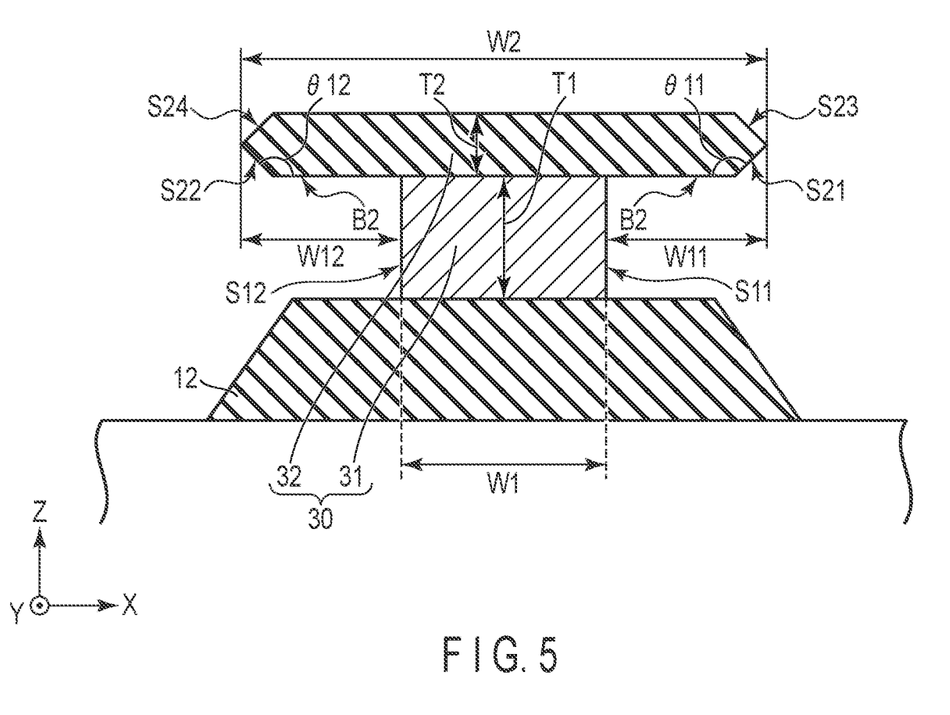
FIG. 5 is an enlarged cross-sectional view showing an example of a partition 30.

FIG. 5 is an enlarged cross-sectional view of an example of the partition 30.

The thickness T1 of the first layer 31 along the third direction Z is twice or more than the thickness T2 of the second layer 32 along the third direction Z (T1>T2). Further, the thickness T1 is less than the width W1 of the first layer 31 along the first direction X (T1<W1). For example, the thickness T1 is 1 μm or more, and the thickness T2 is about 0.5 μm. The width W1 is about some dozen micrometers.

In the first layer 31, the width W1 may be constant or may change as the location is closer to the top along the third direction Z. For example, the first layer 31 may have a cross-sectional shape in which the width W1 increases as the location is closer to the top along the third direction Z (an inverted tapered cross-sectional shape). Alternatively, the first layer 31 may have a cross-sectional shape in which the width W1 decreases as the location is closer to the top along the third direction Z (a forward tapered cross-sectional shape).

The width W2 of the second layer 32 along the first direction X is greater than the width W1 of the first layer 31 (W2>W1). In the second layer 32, a width W11 of the protrusion from the first side surface S11 and a width W12 of the protrusion from the second side surface S12 are, for example, 0.5 μm or more. Here, the width W11 may be equal to or different from the width W12.

The angle θ11 between the bottom surface B2 and the third side surface S21, and the angle θ12 between the bottom surface B2 and the fourth side surface S22 are both obtuse angles. Preferably, the angle θ11 and the angle θ12 should be 135° or more but less than 180°. The angle θ11 may be equivalent to or different from the angle θ12.

Figure 6:
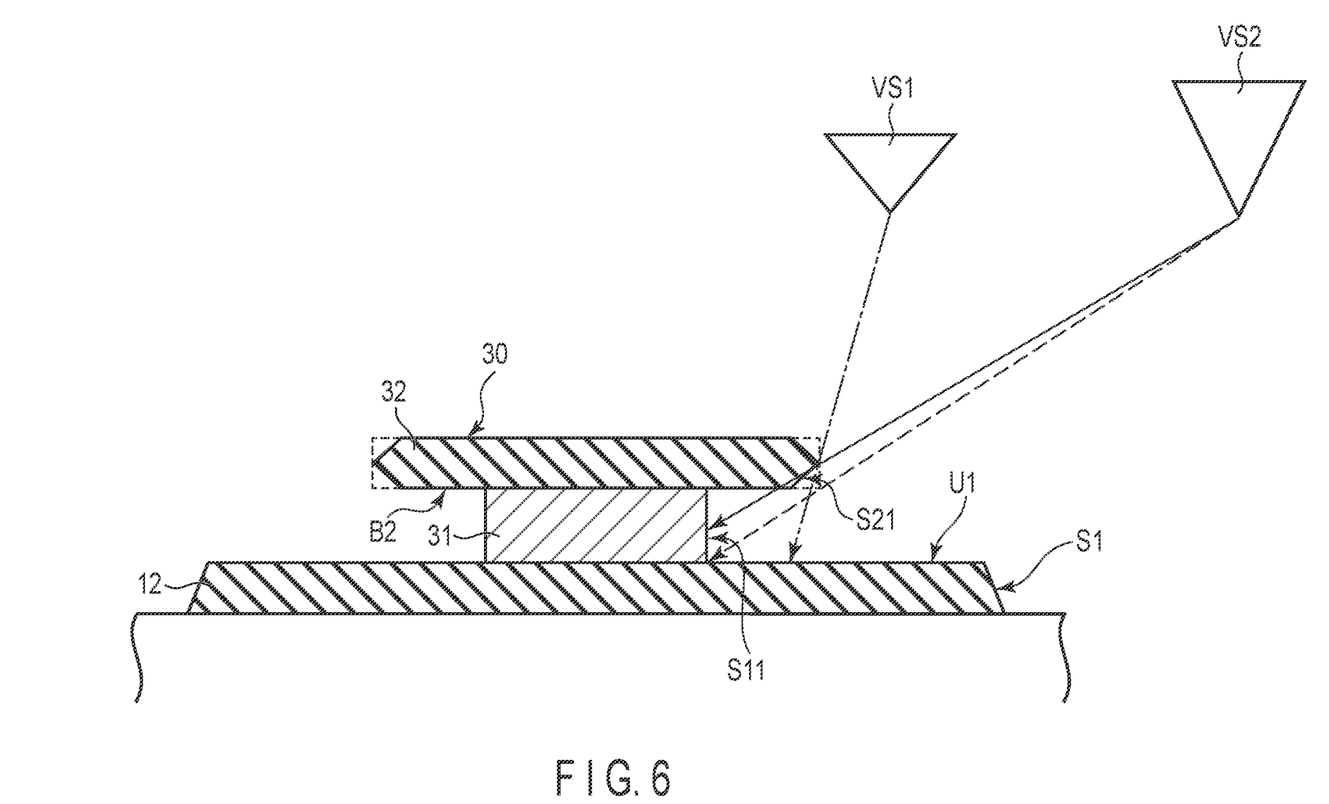
FIG. 6 is a diagram illustrating the processing step of forming the cross-sectional structure shown in FIG. 4.

FIG. 6 is a diagram illustrating a processing step of forming of the cross-sectional structure shown in FIG. 4.

For example, the lower electrode E1 is formed, and then an organic insulating layer is formed. Thereafter, by patterning the organic insulating layer, the insulating layer 12 is formed. Subsequently, a metal layer is formed and then, for example, an insulating layer is formed. Next, the metal and insulating layers are collectively patterned. Here, the conditions are set such etching of the metal layer is more accelerated than etching of the insulating layer, an thus the partition 30 including the first layer 31 and the second layer 32 of such shapes as shown in FIG. 4 is formed.

Thereafter, the layers which constitute the organic layer OR are formed, for example, by the vacuum deposition method. Here, the vapor from the vapor deposition source VS1 passes through the region where there is no partition 30, and reaches the upper surface U1 and the sloping surface S1, which are spaced apart from the first layer 31 as indicated by the single-dot chain line. To the region of the partition 30 that is shaded by the second layer 32 (the first side surface S11 and the region of the upper surface U1, which is close to the first layer 31), the vapor from the vapor deposition source VS1 do not reach. Therefore, the organic layer OR is formed on the upper surface U1 and the sloping surface S1, which are spaced apart from the first layer 31, as well as in the opening.

Thereafter, the upper electrode E2 is formed, for example, by the vacuum deposition or sputtering method. Here, the vapor from the vapor deposition source VS2 passes along the third side surface S21 through the region where there is no partition 30, and reaches the first side surface S11, the upper surface U1 and the sloping surface S1 as indicated by the solid line. Therefore, the upper electrode E2 is formed not only in the opening but also on the sloping surface S1, the upper surface U1 between the sloping surface S1 and the first layer 31, and the first side surface S11. Thus, the upper electrode E2 is formed to be in contact with the first layer 31 which is a conductor.

Note that when the third side surface S21 of the second layer 32 is formed substantially perpendicular to the bottom surface B2 as indicate by the dotted line in the figure, the vapor from the vapor deposition source VS2 does not easily reach the first side surface S11 as indicated by the dotted line.

As described above, a partition 30 is disposed between each adjacent pair of display elements 20, and the organic layer OR formed without a fine mask is divided by the partition 30. Therefore, the display elements 20 comprising the organic layer OR with a desired shape can be provided. Thus, as compared to the case where a fine mask is applied, the manufacturing cost can be reduced. Moreover, such a processing step of positioning of a fine mask, and the like are unnecessary, thus making it possible to easily form the organic layer OR having a desired shape. Furthermore, the light-emitting area can be formed in a predetermined area in the display element 20, and also it is possible to suppress undesired light emission in the area overlapping the insulating layer 12.

Moreover, the upper electrode E2 is divided as well by the partition 30 in a manner similar to that of the organic layer OR, but each upper electrode E2 is brought into contact with the first layer 31 and electrically connected thereto, which is a conductor portion of the partition 30. The first layer 31 is electrically connected to a power feed line of a predetermined potential, in the display area DA or on an outer side of the display area DA. With this configuration, a predetermined potential is supplied to the upper electrode E2 of each display element 20 through the partition 30. That is, the potential drop, which may occur in a part of the upper electrode E2, can be suppressed.

Further, the second layer 32 of the partition 30 has an inverted tapered shape in its cross section at least in its lower part. Therefore, the material that forms the upper electrode E2 also goes around the region shaded by the second layer 32, thereby expanding the area of the upper electrode E2, which is in contact with the first layer 31. With this configuration, it is possible to secure a sufficient size of the contact area between the upper electrode E2 and the first layer 3, and therefore connection errors therebetween can be suppressed.

Furthermore, undesired current leakage (crosstalk), which may be caused by the connection of the organic layers OR in adjacent display elements 20, can be suppressed. Therefore, the desired display performance can be achieved in the display elements 20.

Figure 7:
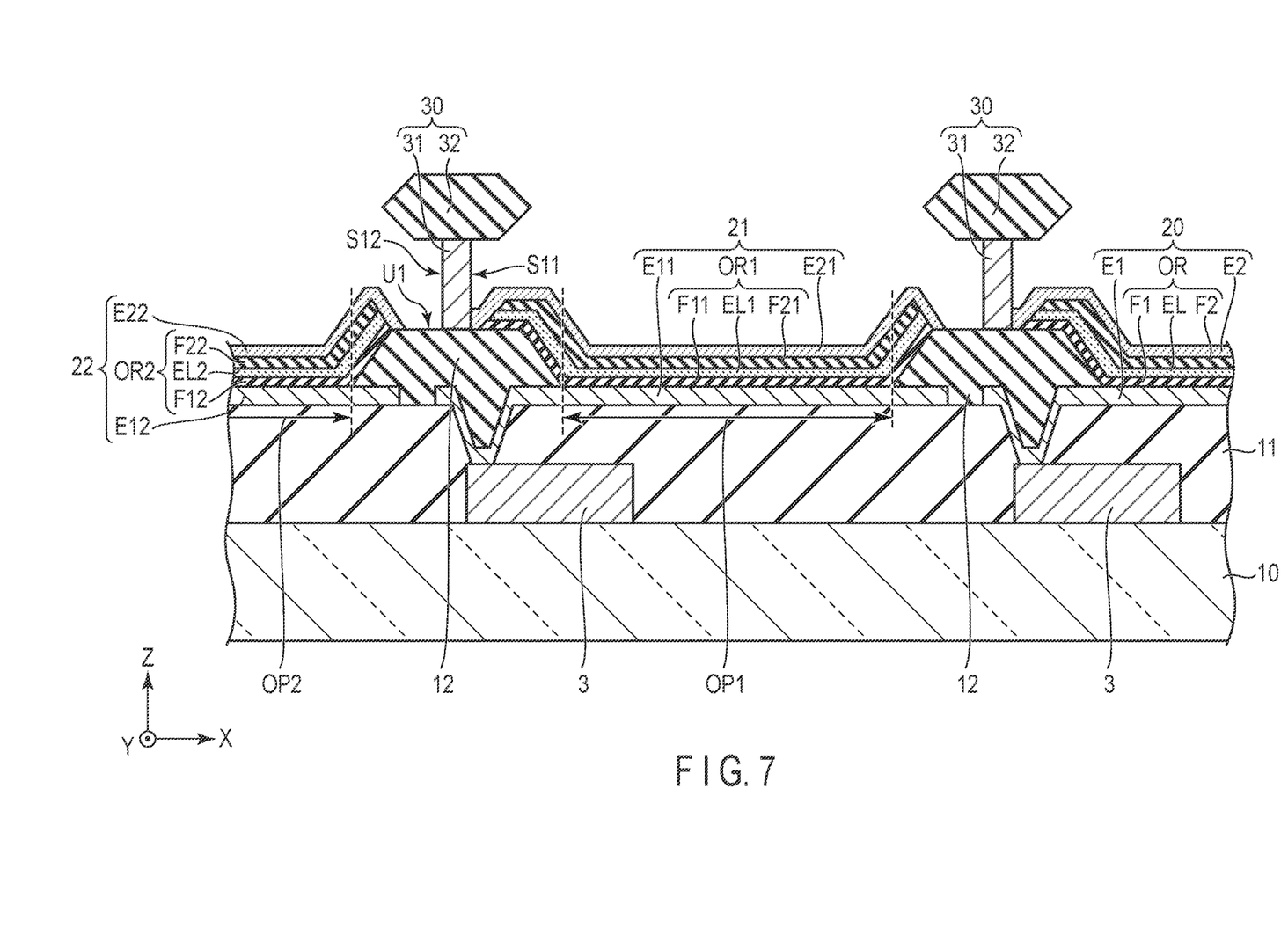
FIG. 7 is a cross-sectional view showing another example of the display element 20.

FIG. 7 is a cross-sectional view showing another example of the display element 20.

Here, the display elements 21 and 22 adjacent to each other along the first direction X will be focused. The partition 30 is located between the display elements 21 and 22, and is disposed on the insulating layer 12. The details of the partition 30 are similar to those of the example provided above, and therefore they will be omitted.

In the display element 21, the upper electrode E21 is in contact with the first side surface S11 of the first layer 31 and further in contact with the insulating layer 12 between the first side surface S11 and the organic layer OR1.

In the display element 22, the upper electrode E22 is spaced apart from the second side surface S12 of the first layer 31. The upper electrode E22 is in contact with the insulating layer 12 between the second side surface S12 and the organic layer OR2, but exposes the insulating layer 12 in the region close to the first layer 31.

Thus, the partition 30 is disposed between adjacent display elements 20, and the upper surface U1 of the insulating layer 12. In the first layer 31 which constitutes the partition 30, one side surface is in contact with the upper electrode E2 of the opposing display element 20, whereas the other side surface is spaced apart from the upper electrode E2 of the opposing display element 20.

When focusing on each display element 20, the partitions 30 are disposed respectively on both sides of the opening OP, and one end portion of the upper electrode E2 is in contact with the first layer 31 of one partition 30, whereas the other end portion of the upper electrode E2 is spaced apart from the first layer 31 of the other partition 30. With this configuration, the upper electrodes E2 of the multiple display elements 20 arranged in the display area DA are electrically connected to each other.

In the example shown in FIG. 7 as well, advantageous effects similar to those of the examples provided above can be obtained.

According to the embodiments described above, it is possible to provide a display device which can supply a predetermined potential to the upper electrodes of the display elements.

Based on the display device which has been described in the above-described embodiments, a person having ordinary skill in the art may achieve a display device with an arbitral design change; however, as long as they fall within the scope and spirit of the present invention, such a display device is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A display device comprising:
   an insulating substrate;
   a first insulating layer disposed above the insulating substrate;
   a first lower electrode and a second lower electrode disposed on the first insulating layer;
   a second insulating layer disposed between the first lower electrode and the second lower electrode on the first insulating layer and comprising a first opening overlapping the first lower electrode and a second opening overlapping the second lower electrode;
   a partition disposed on the second insulating layer;
   a first organic layer including a light-emitting layer, disposed in the first opening and covering the first lower electrode; and
   a first upper electrode covering the first organic layer;
   the partition including:
   a first layer in contact with the second insulating layer, formed of a metal material and including a first side surface facing the first opening, a second side surface facing the second opening, and a first upper surface; and
   a second layer including a bottom surface in contact with the first upper surface, a third side surface facing the first opening, a fourth side surface facing the second opening, and a second upper surface,
   wherein the first upper electrode is in contact with the first side surface,
   the bottom surface extends from the first side surface toward the first opening and extends from the second side surface toward the second opening, and
   a lower portion of the second layer, including the bottom surface, has an inverted tapered shape in cross section, a width of which increases as it is closer to a top from the bottom surface, and an upper portion of the second layer, including a top surface, also having a tapered shape.

2. The display device of claim 1, wherein
   an upper portion of the second layer, including the second upper surface, has a forward tapered shape in cross section, a width of which increases as it is closer to a bottom from the second upper surface.

3. The display device of claim 1, wherein
   an angle between the bottom surface and the third side surface and an angle between the bottom surface and the fourth side surface are 135° or more but less than 180°.

4. The display device of claim 1, wherein
   the first organic layer is spaced apart from the first side surface, and
   the first upper electrode is in contact with the second insulating layer between the first side surface and the first organic layer.

5. The display device of claim 1, further comprising:
   a second organic layer including a light-emitting layer, disposed in the second opening and covering the second lower electrode; and
   a second upper electrode covering the second organic layer,
   wherein the second upper electrode is in contact with the second side surface.

6. The display device of claim 5, wherein
   the second organic layer is spaced apart from the second side surface, and
   the second upper electrode is in contact with the second insulating layer between the second side surface and the second organic layer.

7. The display device of claim 1, wherein
   the partition is formed into a grid pattern in planar view.

8. The display device of claim 1, wherein
   the partition is formed into a stripe pattern in planar view.

9. The display device of claim 1, further comprising:
   a second organic layer including a light-emitting layer, disposed in the second opening and covering the second lower electrode; and
   a second upper electrode covering the second organic layer,
   wherein the second upper electrode is spaced apart from the second side surface.

10. The display device of claim 1, wherein
    the second layer is formed of an insulating material.

11. The display device of claim 1, wherein
    a thickness of the first layer is twice or more a thickness of the second layer.

12. A display device comprising:
    an insulating substrate;
    a first insulating layer disposed above the insulating substrate;
    a first lower electrode and a second lower electrode disposed on the first insulating layer;
    a second insulating layer disposed between the first lower electrode and the second lower electrode on the first insulating layer and comprising a first opening overlapping the first lower electrode and a second opening overlapping the second lower electrode;
    a partition disposed on the second insulating layer;
    a first organic layer including a light-emitting layer, disposed in the first opening and covering the first lower electrode; and
    a first upper electrode covering the first organic layer;
    a second organic layer including a light-emitting layer, disposed in the second opening and covering the second lower electrode; and
    a second upper electrode covering the second organic layer, wherein
    the partition includes:
    a first layer in contact with the second insulating layer, formed of a metal material and including a first side surface facing the first opening, a second side surface facing the second opening and a first upper surface; and
    a second layer including a bottom surface in contact with the first upper surface, a third side surface facing the first opening, a fourth side surface facing the second opening and a second upper surface,
    the first organic layer is spaced apart from the first side surface, the first upper electrode is in contact with the first side surface and in contact with the second insulating layer between the first side surface and the first organic layer, the second organic layer is spaced apart from the second side surface, the second upper electrode is in contact with the second side surface and in contact with the second insulating layer between the second side surface and the second organic layer, the bottom surface extends from the first side surface toward the first opening and extends from the second side surface toward the second opening, and a lower portion of the second layer, including the bottom surface, has an inverted tapered shape in cross section, a width of which increases as it is closer to a top from the bottom surface, and an upper portion of the second layer, including a top surface, also having a tapered shape.

13. The display device of claim 12, wherein
an upper portion of the second layer, including the second upper surface, has a forward tapered shape in cross section, a width of which increases as it is closer to a bottom from the second upper surface.

14. The display device of claim 12, wherein
an angle between the bottom surface and the third side surface and an angle between the bottom surface and the fourth side surface are 135° or more but less than 180°.

15. A display device comprising:
an insulating substrate;
a first insulating layer disposed above the insulating substrate;
a first lower electrode and a second lower electrode disposed on the first insulating layer;
a second insulating layer disposed between the first lower electrode and the second lower electrode on the first insulating layer and comprising a first opening overlapping the first lower electrode and a second opening overlapping the second lower electrode;
a partition disposed on the second insulating layer;
a first organic layer including a light-emitting layer, disposed in the first opening and covering the first lower electrode; and
a first upper electrode covering the first organic layer;
a second organic layer including a light-emitting layer, disposed in the second opening and covering the second lower electrode; and
a second upper electrode covering the second organic layer, wherein
the partition includes:
a first layer in contact with the second insulating layer, formed of a metal material and including a first side surface facing the first opening, a second side surface facing the second opening and a first upper surface; and
a second layer including a bottom surface in contact with the first upper surface, a third side surface facing the first opening, a fourth side surface facing the second opening and a second upper surface,
the first organic layer is spaced apart from the first side surface,
the first upper electrode is in contact with the first side surface and in contact with the second insulating layer between the first side surface and the first organic layer,
the second organic layer is spaced apart from the second side surface,
the second upper electrode is spaced from the second side surface and in contact with the second insulating layer between the second side surface and the second organic layer,
the bottom surface extends from the first side surface toward the first opening and extends from the second side surface toward the second opening, and
a lower portion of the second layer, including the bottom surface, has an inverted tapered shape in cross section, a width of which increases as it is closer to a top from the bottom surface, and an upper portion of the second layer, including a top surface, also having a tapered shape.

16. The display device of claim 15, wherein
an upper portion of the second layer, including the second upper surface, has a forward tapered shape in cross section, a width of which increases as it is closer to a bottom from the second upper surface.

17. The display device of claim 15, wherein
an angle between the bottom surface and the third side surface and an angle between the bottom surface and the fourth side surface are 135° or more but less than 180°.

* * * * *